US012787159B2

(12) United States Patent
Kouno et al.

(10) Patent No.: US 12,787,159 B2
(45) Date of Patent: Nov. 3, 2026

(54) CERAMIC WIRING MEMBER

(71) Applicants: NGK ELECTRONICS DEVICES, INC., Mine (JP); NGK INSULATORS, LTD., Nagoya (JP)

(72) Inventors: Hiroshi Kouno, Mine (JP); Atsushi Mase, Mine (JP)

(73) Assignees: NGK ELECTRONICS DEVICES, INC., Mine (JP); NGK INSULATORS, LTD., Nagoya (JP)

( * ) Notice: Subject to any disclaimer, the term of this patent is extended or adjusted under 35 U.S.C. 154(b) by 146 days.

(21) Appl. No.: 18/898,781

(22) Filed: Sep. 27, 2024

(65) Prior Publication Data

US 2025/0024592 A1 Jan. 16, 2025

Related U.S. Application Data

(63) Continuation of application No. PCT/JP2023/013591, filed on Mar. 31, 2023.

(30) Foreign Application Priority Data

Mar. 31, 2022 (WO) .................. PCT/JP2022/016900

(51) Int. Cl.
*H05K 1/02* (2006.01)
*H05K 1/03* (2006.01)
(Continued)

(52) U.S. Cl.
CPC ......... *H05K 1/0271* (2013.01); *H05K 1/0298* (2013.01); *H05K 1/0306* (2013.01);
(Continued)

(58) Field of Classification Search
CPC .......... H05K 1/09; H05K 1/092; H05K 1/094; H05K 1/097; H05K 1/0271
See application file for complete search history.

(56) References Cited

U.S. PATENT DOCUMENTS

2019/0014663 A1 1/2019 Ide et al.

FOREIGN PATENT DOCUMENTS

JP 2003-347710 A 12/2003
JP 2006-236921 A 9/2006
(Continued)

OTHER PUBLICATIONS

International Search Report of PCT/JP2023/013591 dated Jun. 20, 2023.

(Continued)

*Primary Examiner* — Jeremy C Norris
(74) *Attorney, Agent, or Firm* — MATTINGLY & MALUR, PC

(57) ABSTRACT

The electroconductive portion has a structure including: an electroconductive phase, which is made of a metal component containing at least one of W or Mo and has a plurality of air gaps dispersed so as to be separated from each other; and glass phases, which are contained in at least some of the plurality of air gaps and have an area ratio of 3% or more and 20% or less on a cross section of the plate-shaped portion taken in a thickness direction. A proportion of the number of the glass phases, each having an aspect ratio of 1.5 or less, to a total number of the glass phases on the cross section of the plate-shaped portion taken in the thickness direction is 40% or more.

4 Claims, 4 Drawing Sheets

(51) Int. Cl.
*H05K 1/09* (2006.01)
*H05K 1/183* (2026.01)

(52) U.S. Cl.
CPC ............... *H05K 1/09* (2013.01); *H05K 1/183* (2013.01); *H05K 2201/0209* (2013.01); *H05K 2201/0776* (2013.01)

(56) References Cited

FOREIGN PATENT DOCUMENTS

| | | | |
|---|---|---|---|
| JP | 2018-206849 | A | 12/2018 |
| JP | 2020-096120 | A | 6/2020 |
| WO | 2017/154593 | A1 | 9/2017 |

OTHER PUBLICATIONS

Written Opinion of the International Searching Authority of of PCT/JP2023/013591 dated Jun. 20, 2023.
International Preliminary Report on Patentability received in corresponding International Application No. PCT/JP2023/013591 dated Oct. 10, 2024.

CERAMIC WIRING MEMBER

CROSS-REFERENCE TO RELATED APPLICATION

This application is a continuation application of PCT/JP2023/013591, filed on Mar. 31, 2023, which claims the benefit of priority of Japanese Application No. PCT/2022/016900, filed on Mar. 31, 2022, the entire contents of which are incorporated herein by reference.

TECHNICAL FIELD

The present disclosure relates to a ceramic wiring member.

BACKGROUND ART

There has been known a ceramic wiring member including a main body portion and electroconductive portions. The main body portion is made of ceramic and has a plate-shaped portion. The electroconductive portions are arranged in contact with the plate-shaped portion, and are each formed of a material containing a metal. Such ceramic wiring member is used as a member for holding an electronic component. The electroconductive portions form a part of a path for a current to the electronic component or from the electronic component. In such ceramic wiring member, it is important to reduce electrical resistance of the electroconductive portions. Meanwhile, warpage may occur in a ceramic wiring board due to a difference in linear expansion coefficient between the ceramic of the main body portion and the metal of the electroconductive portion. When the warpage increases, a problem such as separation of the electroconductive portion from the main body portion may arise. Thus, it is desired that the warpage be reduced.

The warpage can be reduced by, for example, introducing a glass phase made of ceramic into the electroconductive portion so as to make a linear expansion coefficient of the electroconductive portion closer to a linear expansion coefficient of the main body portion. It has been known that the glass phase is formed in the electroconductive portion during a process of manufacturing the ceramic wiring member. The glass phase is mainly made of a component that is added as a sintering aid and contained in the ceramic of the main body portion (see, for example, Japanese Patent Application Laid-open No. 2003-347710 (Patent Literature 1)). It is considered that, although the formation of the glass phase increases the electrical resistance of the electroconductive portion, the formation of an appropriate amount of the glass phase can reduce the warpage while keeping an increase in electrical resistance within an allowable range.

CITATION LIST

Patent Literature

[PTL 1] JP 2003-347710 A

SUMMARY OF INVENTION

Technical Problem

However, even when a ratio of the glass phase to the electroconductive portion is set to fall within an appropriate range as described above, there are some cases in which the electrical resistance increases and exceeds the allowable range or the warpage cannot be sufficiently reduced.

One of the objects of the present disclosure is to provide a ceramic wiring member that enables achievement of both of a reduction in warpage and a reduction in electrical resistance of an electroconductive portion.

Solution to Problem

A ceramic wiring member according to the present disclosure includes: a main body portion, which is made of ceramic and has a plate-shaped portion; and an electroconductive portion arranged in contact with the plate-shaped portion. The electroconductive portion has a structure including: an electroconductive phase, which is made of a metal component containing at least one of tungsten (W) or molybdenum (Mo) and has a plurality of air gaps dispersed so as to be separated from each other; and glass phases, which are contained in the plurality of air gaps and have an area ratio of 3% or more and 20% or less on a cross section of the plate-shaped portion taken in a thickness direction. A proportion of the number of the glass phases, each having an aspect ratio of 1.5 or less, to a total number of the glass phases on the cross section of the plate-shaped portion taken in the thickness direction is 40% or more.

Advantageous Effects of Invention

According to the ceramic wiring member described above, achievement of both of a reduction in warpage and a reduction in electrical resistance of the electroconductive portion is enabled.

DESCRIPTION OF EMBODIMENTS

Outline of Embodiments

Figure 1:
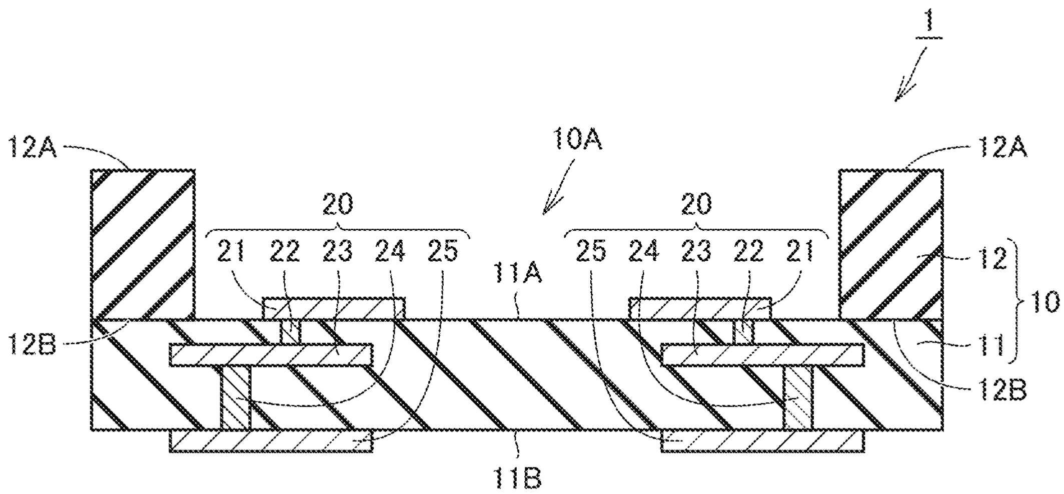
FIG. 1 is a schematic sectional view for illustrating a structure of a ceramic wiring member.

First, embodiments of the present disclosure are described in order. A ceramic wiring member according to a first aspect of the present disclosure includes: a main body portion, which is made of ceramic and has a plate-shaped portion; and an electroconductive portion arranged in contact with the plate-shaped portion. The electroconductive portion has a structure including: an electroconductive phase, which is made of a metal component containing at least one of W or Mo and has a plurality of air gaps dispersed so as to be separated from each other; and glass phases, which are contained in at least some of the plurality of air gaps and have an area ratio of 3% or more and 20% or less on a cross section of the plate-shaped portion taken in a thickness direction. A proportion of the number of the glass phases, each having an aspect ratio of 1.5 or less, to a total number of the glass phases on the cross section of the plate-shaped portion taken in the thickness direction is 40% or more.

In the ceramic wiring member according to the first aspect, a proportion of the number of the glass phases, each having the aspect ratio of 2 or less, to the total number of the glass phases on the cross section of the plate-shaped portion taken in the thickness direction may be 65% or more.

The inventors of the present invention have examined causes of an increase in electrical resistance exceeding an allowable range and impossibility of sufficiently reducing warpage even with a ratio of the glass phases to the electroconductive portion being set to fall within an appropriate range. As a result, the following finding has been obtained.

A value of the electrical resistance and a value of the warpage are affected by shapes of the glass phases that are contained in the air gaps. Specifically, when the shape of each of the glass phases is far from a spherical shape, that is, when the aspect ratio of each of the glass phases on the cross section of the plate-shaped portion taken in the thickness direction is large, the shapes of the glass phases greatly affect an increase in the value of the electrical resistance and an increase in the value of the warpage. The reason for this is considered, for example, as follows. When the aspect ratio of the glass phase is large, a stress is more liable to concentrate in the vicinity of each of distal ends of the glass phase in its longitudinal direction. Thus, when a stress is applied to the electroconductive portion during a process of manufacturing the ceramic wiring member after the main body portion and the electroconductive portions are baked, the stress concentrates in the vicinity of each of the distal ends, resulting in generating micro-cracks in the electroconductive phase. The generation of the cracks increases the electrical resistance of the electroconductive portion. Further, a large aspect ratio of the glass phase results in a difference in amount of expansion between a major-axis direction and a minor-axis direction. In such a case, the glass phase does not isotropically contract (or isotropically expand) in a three-dimensional manner. As a result, a non-uniform stress is generated, resulting in an increase in the value of the warpage.

Meanwhile, when the aspect ratio of the glass phase is close to 1, that is, when the shape of the glass phase is close to a spherical shape, the presence of the glass phases less affects an increase in the value of the electrical resistance and an increase in the value of the warpage. More specifically, when a proportion of the number of glass phases, each having the aspect ratio of 1.5 or less, to the total number of glass phases is 40% or more, preferably when the proportion of the number of glass phases, each having the aspect ratio of 1.5 or less, to the total number of glass phases is 40% or more and a proportion of the number of glass phases, each having the aspect ratio of 2 or less, to the total number of glass phases is 65% or more on the cross section of the plate-shaped portion taken in the thickness direction, the presence of the glass phases less affects an increase in the value of the electrical resistance and an increase in the value of the warpage. As a result, the ceramic wiring member according to the present disclosure enables achievement of both of a reduction in warpage and a reduction in electrical resistance of the electroconductive portions.

Here, in this application, the wording “aspect ratio of the glass phase” refers to a ratio of a major axis of an ellipse with a minimum area containing a glass phase to a minor axis of the ellipse. The aspect ratio can be obtained, for example, as follows. For the electroconductive portion, the cross section of the plate-shaped portion taken in the thickness direction is observed with a scanning electron microscope. After the obtained image data is monochromatically binarized with image processing software, an ellipse with a minimum area containing a glass phase is determined. A ratio (major axis/minor axis) of a major axis to a minor axis of the ellipse is then calculated to thereby obtain the aspect ratio. Data is acquired so that the image data contains one hundred and fifty or more glass phases. Further, in this application, the glass phase may contain, besides a glass component contained in the main body portion, a slight amount of crystal of a ceramic main component (alumina) contained in the main body portion or a metal component contained in the electroconductive portion. Further, the glass phase may contain a glass component that is not contained in the main body portion.

In the ceramic wiring member described above, the electroconductive portion may include: a first portion being in contact with a first principal surface of the plate-shaped portion; and a second portion being in contact with a second principal surface of the plate-shaped portion, the second portion being positioned on a side opposite to the first principal surface in a thickness direction of the plate-shaped portion. As described above, when the first principal surface and the second principal surface of the plate-shaped portion are electrically connected to each other through intermediation of the electroconductive portion reduced in electrical resistance, a high-performance ceramic wiring member that is adaptable to power saving and higher communication speed can be obtained.

SPECIFIC EXAMPLES OF EMBODIMENTS

Next, specific embodiments of a ceramic wiring member according to the present disclosure are described with reference to the drawings. In the drawings referred to below, the same or corresponding parts are denoted by the same reference symbols, and a description thereof is not repeated.

First Embodiment

FIG. 1 is a schematic sectional view for illustrating a structure of a ceramic wiring member according to one embodiment of the present disclosure. With reference to FIG. 1, a ceramic wiring member 1 according to this embodiment includes a main body portion 10 made of ceramic and electroconductive portions 20. The ceramic for forming the main body portion 10 is not particularly limited, but, for example, aluminum oxide ($Al_2O_3$) can be employed. Further, the ceramic for forming the main body portion 10 may contain, as a sintering aid, at least one glass component selected from the group consisting of an oxide containing Si, an oxide containing Ca, an oxide containing Mg, an oxide containing Mn, and an oxide containing Ba.

The main body portion 10 includes a bottom wall portion 11 and a side wall portion 12. The bottom wall portion 11 corresponds to a first plate-shaped portion having a plate-like shape. The side wall portion 12 corresponds to a second plate-shaped portion having a plate-like shape. The bottom wall portion 11 has a flat plate-like shape. The bottom wall portion 11 has a first principal surface 11A and a second principal surface 11B. The second principal surface 11B is positioned on a side opposite to the first principal surface 11A in a thickness direction. A shape in plan view (shape viewed in a direction perpendicular to the first principal surface 11A) of the bottom wall portion 11 is, for example, rectangular.

The side wall portion 12 has a plate-like shape rising from an outer edge of the first principal surface 11A of the bottom wall portion 11. More specifically, the side wall portion 12 has a shape, for example, formed by connecting four flat plates corresponding to sides of the outer edge of the first principal surface 11A of the bottom wall portion 11 having a rectangular shape in plan view. The side wall portion 12 may be arranged, for example, so as to surround a cavity 10A being a space above the first principal surface 11A when viewed in the direction perpendicular to the first principal surface 11A. The side wall portion 12 includes a first end surface 12A and a second end surface 12B. The first end surface 12A has a planar shape. The second end surface 12B is an end surface having a planar shape on a side opposite to the first end surface 12A in the thickness direction of the bottom wall portion 11. The side wall portion 12 is connected to the first principal surface 11A of the bottom wall portion 11 at the second end surface 12B. The first end surface 12A is entirely positioned on a single plane. As a result, when a lid member having a flat plate shape is placed on the first end surface 12A, the cavity 10A can be closed. An electronic component that requires airtightness, such as a quartz crystal unit can be housed inside the cavity 10A. The ceramic wiring member 1 described above can be used as a ceramic package.

In this embodiment, the ceramic wiring member 1 includes a pair of electroconductive portions 20. Each of the electroconductive portions 20 includes an internal terminal 21, an external terminal 25, and an internal wiring 23. The internal terminal 21 corresponds to a first portion arranged in contact with the first principal surface 11A. The external terminal 25 corresponds to a second portion arranged in contact with the second principal surface 11B. The internal wiring 23 is arranged inside the bottom wall portion 11. Each of the electroconductive portions 20 further includes a first connecting portion 22 and a second connecting portion 24. The first connecting portion 22 connects the internal terminal 21 and the internal wiring 23 to each other. The second connecting portion 24 connects the internal wiring 23 and the external terminal 25 to each other. The internal wiring 23, the first connecting portion 22, and the second connecting portion 24 are third portions that connect the internal terminal 21 corresponding to the first portion and the external terminal 25 corresponding to the second portion to each other. Each of the internal terminal 21, the external terminal 25, the internal wiring 23, the first connecting portion 22, and the second connecting portion 24 is a part of the electroconductive portion 20 that is arranged in contact with the bottom wall portion 11 corresponding to the first plate-shaped portion. As a modification example of the first connecting portion 22 and the second connecting portion 24, for example, a castellation may be formed in a side surface of the bottom wall portion 11, and an electroconductive portion may be provided on a surface of the castellation.

Figure 2:
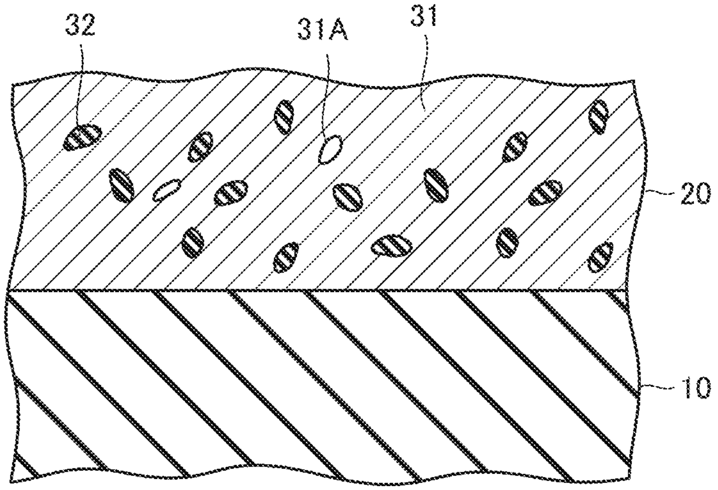
FIG. 2 is a schematic sectional view for illustrating a structure around an interface between a main body portion (plate-shaped portion) and an electroconductive portion.

With reference to FIG. 2, a structure of at least one, preferably structures of all of the internal terminal 21, the external terminal 25, the internal wiring 23, the first connecting portion 22, and the second connecting portion 24 of the electroconductive portion 20 includes an electroconductive phase 31 and glass phases 32. The electroconductive phase 31 is made of a metal component containing at least one of W or Mo and has a plurality of air gaps 31A that are dispersed so as to be separated from each other. The glass phases 32 are contained in the plurality of gaps 31A and have an area ratio of 3% or more and 20% or less on a cross section of the bottom wall portion 11 taken in a thickness direction. When the area ratio of the glass phases 32 is set to 20% or less, an increase in electrical resistance of the electroconductive portion 20 can be suppressed. When the area ratio of the glass phases 32 is set to 3% or more, desirably 8% or more, a difference in linear expansion coefficient between the electroconductive portion 20 and the main body portion 10 can be reduced. The glass phases 32 in the electroconductive portions 20 basically intrude from the main body portion due to a capillary action at the time of sintering. However, a glass component that is not contained in the main body portion 10 may be contained in the glass phase 32. In terms of the electrical resistance and strength, it is desired that the air gap 31A that is not filled with the glass phase 32 be 5% or less, more desirably 1% or less in area ratio on the cross section of the electroconductive portion 20. A proportion of the number of glass phases 32, each having an aspect ratio of 1.5 or less, to a total number of the glass phases 32 is 40% or more on the cross section of the bottom wall portion 11 taken in the thickness direction (cross section illustrated in FIG. 2). It is desired that a major axis of an ellipse obtained for each of the glass phases 32 by ellipse fitting described later be 0.1 μm or larger and 4 μm or smaller. When the major axis of the ellipse is set to 0.1 μm or larger, the air gaps 31A in the electroconductive portion 20 are suppressed to increase strength of the electroconductive portion 20. Further, when the major axis of the ellipse is set to 4 μm or smaller, electrical resistance of the electroconductive portion 20 can be reduced.

In the ceramic wiring member 1 according to this embodiment, the proportion of the number of the glass phases 32, each having the aspect ratio of 1.5 or less, to the total number of the glass phases 32 is 40% or more on the cross section of the bottom wall portion 11 corresponding to the plate-shaped portion taken in the thickness direction. Thus, the presence of the glass phases 32 less affects an increase in a value of the electrical resistance of the electroconductive portion 20 and an increase in a value of the warpage. As a result, the ceramic wiring member 1 according to this embodiment is a ceramic wiring member in which both of a reduction in warpage and a reduction in electrical resistance of the electroconductive portion 20 are achieved.

In the ceramic wiring member 1 according to this embodiment as described above, it is preferred that the proportion of the number of the glass phases, each having the aspect ratio of 2 or less, to the total number of the glass phases 32 be 65% or more. Thus, the influence of the presence of the glass phases 32 on the increase in the value of the electrical resistance of the electroconductive portion 20 and the increase in the value of the warpage is more reliably reduced. As a result, the ceramic wiring member 1 according to this embodiment can be a ceramic wiring member in which both of the reduction in warpage and the reduction in electrical resistance of the electroconductive portion 20 are more reliably achieved.

Figure 3:
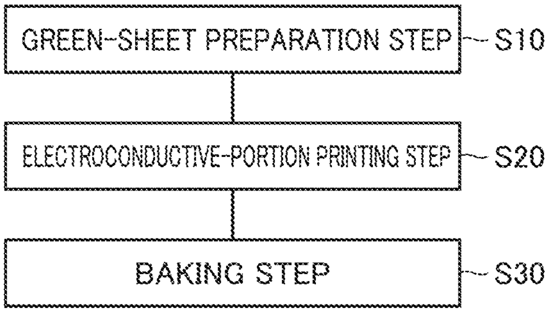
FIG. 3 is a flowchart for outlining a method of manufacturing the ceramic wiring member.

Next, one example of a method of manufacturing the ceramic wiring member 1 according to this embodiment is described. FIG. 3 is a flowchart for outlining the method of manufacturing the ceramic wiring member. With reference to FIG. 3, in the method of manufacturing the ceramic wiring member 1 according to this embodiment, a green-sheet preparation step is first carried out as Step S10. In Step S10, green sheets, which are used to form the main body portion 10, are prepared. Specifically, $Al_2O_3$ being a main component of a ceramic powder, and a sintering aid powder, which form the main body portion 10, and further, a resin, a solvent, and the like, which do not form the main body portion 10 (specifically, disappear at the time of baking), are mixed together in a ball mill to obtain a slurry. The slurry is processed into a green sheet through a doctor blade process. As a result, the green sheets, which are used to form the main body portion 10, are obtained. Here, with reference to FIG. 1, a plurality of green sheets, each having a rectangular shape in plan view, are prepared as green sheets that are used to form the bottom wall portion 11. Further, a plurality of green sheets that are used to form the side wall portion 12 are also prepared. As the green sheets used to form the side wall portion 12, Loop-shaped green sheets, each having a rectangular shape in plan view and being obtained by removing a portion (central portion) corresponding to the cavity 10A, are prepared.

Next, an electroconductive-portion printing step is carried out as Step S20. In Step S20, a paste used to form the electroconductive portions 20 is printed on the green sheets, which have been prepared in Step S10. Specifically, the first metal component, which is at least one of W or Mo, at least one second metal component selected from the group consisting of Ni, Co, and Fe, an additive, a resin, a solvent, and the like are blended. Further, a ceramic powder is added as needed and kneaded to form a paste. The ceramic powder may be the same as that used to form the main body portion 10 or may be different therefrom.

The paste is printed by, for example, screen printing on the green sheets prepared in Step S10. As a result, with reference to FIG. 1, the green sheet having the paste printed on regions corresponding to the external terminals 25, the green sheet having the paste printed on regions corresponding to the second connecting portions 24, the green sheet having the paste printed on regions corresponding to the internal wiring 23, the green sheet having the paste printed on regions corresponding to the first connecting portions 22, and the green sheet having the paste printed on regions corresponding to the internal terminals 21 are formed as the green sheets to be used to form the bottom wall portion 11 and are dried. After that, the green sheets are laminated in the stated order. The drying can be carried out under a condition of, for example, heating at 110° C. and holding for five minutes.

Further, a plurality of green sheets (Loop-shaped green sheets, each obtained by removing the portion corresponding to the cavity 10A), which have been prepared in Step S10 and are used to form the side wall portion 12, are further laminated. In this manner, a laminate of the green sheets is obtained.

Next, a baking step is carried out as Step S30. In this step, the laminate of the green sheets, which has been prepared in Step S20, is baked. The baking is performed by, for example, heating at a temperature of 800° C. or higher and 1,600° C. or lower in an atmosphere of a mixture of hydrogen, nitrogen, and water vapor. The heating temperature is selected, in consideration of sufficient progress of sintering, from a temperature range that enables suppression of formation of an intermetallic compound phase made of an intermetallic compound of the first metal component and the second metal component in the structure of the electroconductive portions 20. Through the procedure described above, the ceramic wiring member 1 according to this embodiment can be manufactured.

With the method of manufacturing the ceramic wiring member 1 according to this embodiment, in Step S20, the second metal component is used in addition to the first metal component as the metal components for forming the electroconductive phase 31. The second metal component is added to the first metal component at a percentage of 0.1% or more and 10% or less. A remaining part of the metal components other than the first metal component and the second metal component consists only of incidental impurities. The addition of the second metal component can suppress the intrusion of the g glass phases containing the sintering aid, which is contained in the main body portion 10 as a component, into the electroconductive portion 20 in step S30. Further, the addition of the second metal component can promote sintering of a metal powder corresponding to a raw material powder of the electroconductive portion 20. As a result, connection between the glass phases 32 contained in the air gaps 31A adjacent to each other is suppressed, and thus each of the glass phases 32 has a reduced aspect ratio. The method of manufacturing the ceramic wiring member 1 according to this embodiment is not limited to the manufacturing method described above. However, the manufacturing method described above enables easy manufacture of the ceramic wiring member 1 according to this embodiment.

Second Embodiment

Figure 4:
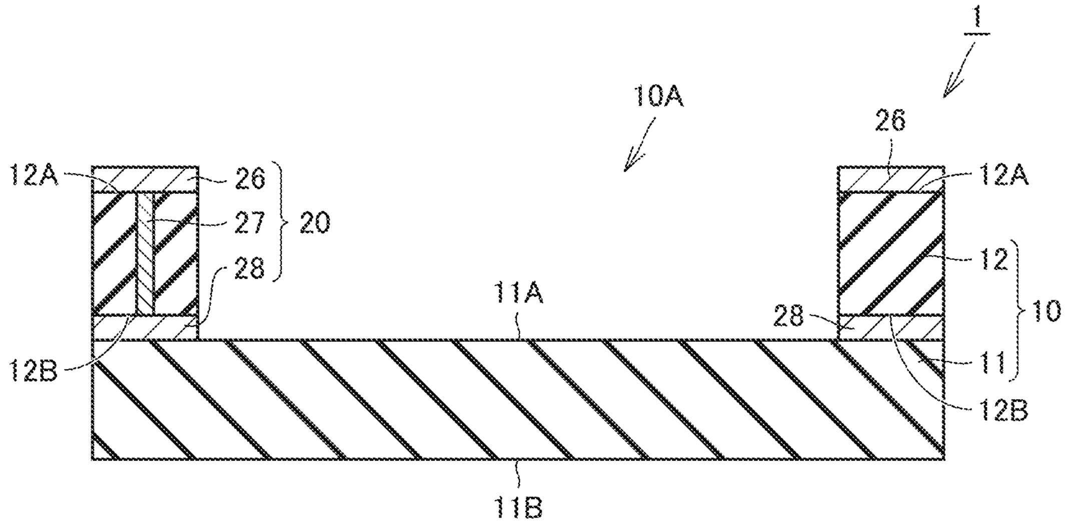
FIG. 4 is a schematic sectional view for illustrating a structure of a ceramic wiring member according to a second embodiment.

Next, a second embodiment, which is another embodiment of the present disclosure, is described. FIG. 4 is a schematic sectional view for illustrating a structure of a ceramic wiring member according to the second embodiment. FIG. 4 corresponds to FIG. 1 that has been referred to for the description of the first embodiment. With reference to FIG. 4 and FIG. 1, a ceramic wiring member 1 according to the second embodiment basically has the same configurations as those of the ceramic wiring member according to the first embodiment and provides the same effects. However, the ceramic wiring member 1 according to the second embodiment is different from that according to the first embodiment mainly in the arrangement and the structure of the electroconductive portions. Now, the second embodiment is described mainly for differences from the first embodiment.

With reference to FIG. 4, the electroconductive portions 20 of the ceramic wiring member 1 according to the second embodiment each include an upper terminal 26, a lower terminal 28, and a third connecting portion 27. The upper terminal 26 corresponds to a first portion arranged in contact with a first end surface 12A. The lower terminal 28 corresponds to a second portion arranged in contact with a second end surface 12B. The third connecting portion 27 connects the upper terminal 26 and the lower terminal 28 to each other. The lower terminal 28 is arranged in contact also with a first principal surface 11A of a bottom wall portion 11. Each of the upper terminal 26, the lower terminal 28, and the third connecting portion 27 is a part of the electroconductive portion 20 that is arranged in contact with a side wall portion 12 corresponding to a second plate-shaped portion.

Similarly to the internal terminal 21 or the like according to the first embodiment, at least one of, preferably all, of the upper terminal 26, the lower terminal 28, and the third connecting portion 27 of the electroconductive portion 20 has a composition including a first metal component and at least one second metal component. The first metal component corresponds to a main component and is at least any one of W or Mo. The at least one second metal component is selected from the group consisting of Ni, Co, and Fe and is contained at 0.1% or more and 10% or less in total to the first metal component. Further, similarly to the internal terminal 21 or the like according to the first embodiment, at least one, preferably all, of the upper terminal 26, the lower terminal 28, and the third connecting portion 27 of the electroconductive portion 20 has a structure including an electroconductive phase made of an alloy of the first metal component and the second metal component. Further, at least one, preferably all, of the upper terminal 26, the lower terminal 28, and the third connecting portion 27 of the electroconductive portion 20 has a structure including glass phases 32 made of a ceramic component at 3% or more and 20% or less in area ratio on a cross section of the electroconductive portion 20.

Also from the ceramic wiring member 1 according to this embodiment, the same effects as those obtained in the first embodiment can be obtained. Further, the ceramic wiring member 1 according to this embodiment can be manufactured in the same manner as in the first embodiment except mainly for a change in the arrangement of the electroconductive portions 20. In this embodiment, the bottom wall portion 11 is made of ceramic, which is an insulator. However, a conductor such as metal may be employed as a material for forming the bottom wall portion 11.

Third Embodiment

Figure 5:
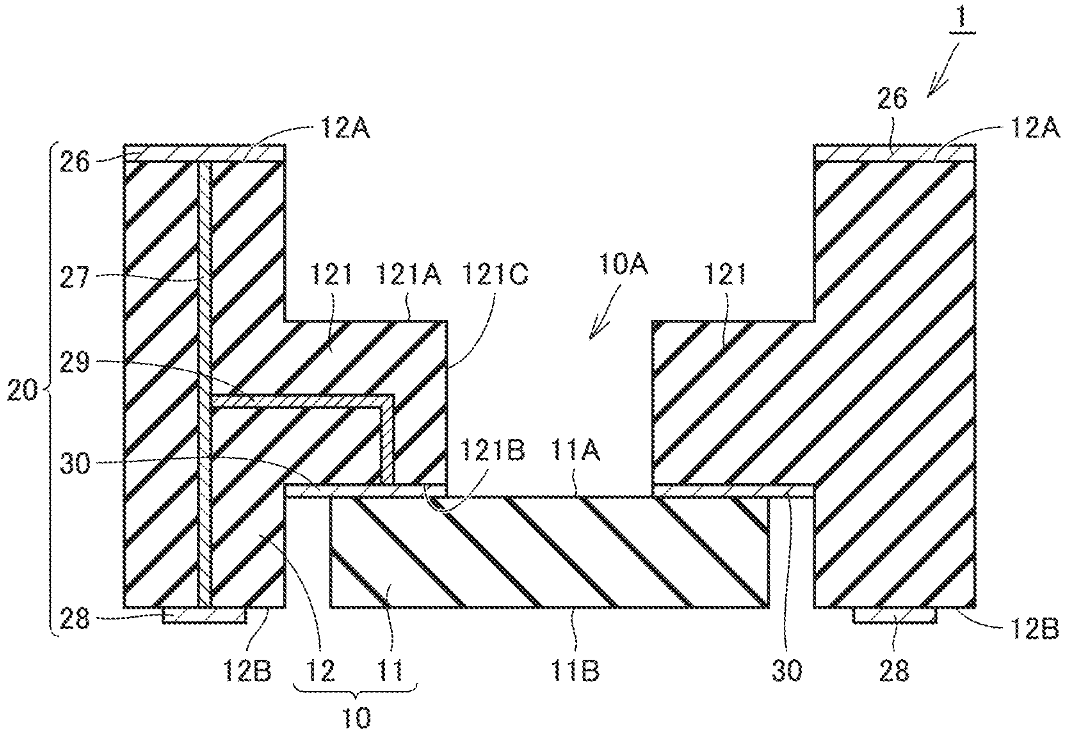
FIG. 5 is a schematic sectional view for illustrating a structure of a ceramic wiring member according to a third embodiment.

Next, a third embodiment, which is still another embodiment of the present disclosure, is described. FIG. 5 is a schematic sectional view for illustrating a structure of a ceramic wiring member according to the third embodiment. FIG. 5 corresponds to FIG. 1 that has been referred to for the description of the first embodiment. With reference to FIG. 5 and FIG. 1, a ceramic wiring member 1 according to the third embodiment basically has the same configurations as those of the ceramic wiring member according to the first embodiment and provides the same effects. However, the ceramic wiring member 1 according to the third embodiment is different from that according to the first embodiment mainly in the structure of the main body portion and the arrangement and the structure of the electroconductive portions. Now, the third embodiment is described mainly for differences from the first embodiment.

With reference to FIG. 5, a side wall portion 12 of the ceramic wiring member 1 according to the third embodiment includes protruding portions 121. The protruding portions 121 protrude toward regions that face each other across a cavity 10A. Each of the protruding portions 121 includes a first surface 121B, a second surface 121A, and a third surface 121C. The first surface 121B faces a first principal surface 11A of a bottom wall portion 11. The second surface 121A is positioned on a side opposite to the first surface 121B in a thickness direction of the bottom wall portion 11. The third surface 121C is a distal end surface that connects the first surface 121B and the second surface 121A to each other. A region of the first surface 121B, which includes its distal end connected to the third surface 121C, faces the first principal surface 11A, and the other region (region corresponding to the vicinity of a root of the protruding portion 121) does not face the first principal surface 11A.

The electroconductive portions 20 each include an upper terminal 26, a lower terminal 28, and a third connecting portion 27. The upper terminal 26 corresponds to a first portion arranged in contact with a first end surface 12A. The lower terminal 28 corresponds to a second portion arranged in contact with a second end surface 12B. The third connecting portion 27 connects the upper terminal 26 and the lower terminal 28 to each other. The electroconductive portion 20 further includes an intermediate terminal 30 and a fourth connecting portion 29. The intermediate terminal 30 is arranged in contact with the first surface 121B. The fourth connecting portion 29 connects the intermediate terminal 30 and the third connecting portion 27 to each other. The intermediate terminal 30 is arranged so as to be also in contact with the first principal surface 11A of the bottom wall portion 11. Each of the upper terminal 26, the lower terminal 28, the third connecting portion 27, the intermediate terminal 30, and the fourth connecting portion 29 is a part of the electroconductive portion 20 that is arranged in contact with the side wall portion 12.

Similarly to the internal terminal 21 or the like according to the first embodiment, at least one, preferably all, of the upper terminal 26, the lower terminal 28, the third connecting portion 27, the intermediate terminal 30, and the fourth connecting portion 29 of the electroconductive portion 20 has a composition including a first metal component and at least one second metal component. The first metal component corresponds to a main component and is at least any one of W or Mo. The at least one second metal component is selected from the group consisting of Ni, Co, and Fe and is contained at 0.1% or more and 10% or less in total to the first metal component. Further, similarly to the internal terminal 21 or the like according to the first embodiment, at least one, preferably all, of the upper terminal 26, the lower terminal 28, and the third connecting portion 27 of the electroconductive portion 20 has a structure including an electroconductive phase made of an alloy of the first metal component and the second metal component. The term "alloy" refers to not only a solid solution of the first metal component and the second metal component but also a mixture of the first metal component and the second metal component, which has not formed a solid solution. Further, at least one, preferably all, of the upper terminal 26, the lower terminal 28, the third connecting portion 27, the intermediate terminal 30, and the fourth connecting portion 29 of the electroconductive portion 20 has a structure including glass phases 32 made of a ceramic component at 3% or more and 20% or less in area ratio on a cross section of the electroconductive portion 20.

Also from the ceramic wiring member 1 according to this embodiment, the same effects as those obtained in the first embodiment can be obtained. Further, the ceramic wiring member 1 according to this embodiment can be manufactured in the same manner as in the first embodiment except mainly for a change in the structure of the main body portion 10 and the arrangement of the electroconductive portions 20. In this embodiment, the bottom wall portion 11 is made of ceramic, which is an insulator. However, a conductor such as metal may be employed as a material for forming the bottom wall portion 11. Further, in the embodiments described above, the shapes of the main body portion 10 have been exemplified. However, the shape of the main body portion according to the present disclosure is not limited to those exemplified above. Various shapes such as a cuboidal shape, a spherical shape, and a membranous shape can be employed as the shape of the main body portion.

EXAMPLES

An experiment for checking influences of the area ratio of the glass phases and the aspect ratio of the glass phase on a resistivity of the electroconductive portion, the warpage of the ceramic wiring member, and adhesive strength of the electroconductive portion to the main body portion was conducted. A procedure of the experiment is as follows.

The electroconductive portion 20, which was arranged in contact with the main body portion 10, was formed in the same procedure as that of the manufacturing method that has been described in the embodiments. A resistivity of the electroconductive portion 20, warpage of the ceramic wiring member 1, and adhesive strength of the electroconductive portion 20 to the main body portion 10 were checked. Specifically, in Step S10, green sheets containing an $Al_2O_3$ powder, at least one powder selected from the group consisting of $SiO_2$, Cao, MgO, MnO, and BaO, each being a sintering aid, a resin, a solvent, and the like were prepared.

Next, in Step S20, a paste containing the first metal component was printed on the green sheets prepared in Step S10 and was dried. A ceramic component was not added to the paste. The drying was performed under a condition of heating at 110° C. and holding for five minutes. In this case, at least one of W or Mo was employed as the first metal component. Further, to change the area ratio of the glass phases and the aspect ratio of each of the glass phases, the amount of addition of Ni, Co, or Fe, each corresponding to the second metal component, was varied. A sample without containing the second metal component was also formed.

Then, in Step S30, the green sheets on which the paste had been printed were baked. The baking was performed by heating from a room temperature to a predetermined temperature in an atmosphere of a mixture of hydrogen, nitrogen, and water vapor and then cooling to the room temperature. As a result, samples, each including a main body portion that was made of ceramic and had a plate-shaped portion, were obtained. An electroconductive portion was arranged on one principal surface of the main body portion. In the samples, an electroconductive portion or an internal wiring was not formed on another main principal surface. The electroconductive portion after baking had air gaps without containing a glass phase at 1% or less in area ratio.

For the obtained samples, an area ratio of glass phases in the electroconductive portion, a proportion of glass phases, each having the aspect ratio of 1.5 or less, and a proportion of the number of glass phases, each having the aspect ratio of 2 or less, to a total number of glass phases, on a cross section of the plate-shaped portion taken in a thickness direction were checked. Specifically, for the obtained samples, the cross section of the electroconductive portion 20 was observed with a scanning electron microscope. Then, after obtained image data was monochromatically binarized with image processing software, areas of the glass phases 32 were added up to calculate the area ratio of the glass phases 32 to the electroconductive portion 20. Further, an ellipse with a minimum area containing a glass phase was determined (ellipse fitting) and a ratio (major axis/minor axis) of a major axis to a minor axis of the ellipse was calculated to obtain the aspect ratio of each of the glass phases. Then, the number of glass phases, each having the aspect ratio of 1.5 or less, was calculated based on the obtained aspect ratio of each of the glass phases. Based on the result of this calculation, the proportion of the number of glass phases, each having the aspect ratio of 1.5 or less, and the proportion of the number of glass phases, each having the aspect ratio of 2 or less, to the total number of glass phases within a field of view of the observation with the scanning electron microscope were calculated. For the image processing described above, ImageJ (free software) was used.

In addition, a resistivity of the electroconductive portion 20 was checked for the obtained samples. Specifically, electrical resistance of the electroconductive portion 20 was first measured by a 4-terminal method for the obtained samples. For the measurement of the electrical resistance, RM3544-01 manufactured by Hioki E. E. Corporation was used. Then, the resistivity was calculated from the obtained electrical resistance, a length of the electroconductive portion 20, and a sectional area thereof perpendicular to a longitudinal direction.

Further, for the obtained samples, warpage was measured. Specifically, a value of warpage of each of the samples was checked using a three-dimensional profile measurement apparatus (model number VK-X1000) manufactured by Keyence Corporation. The value of the warpage was measured in such a manner that, when the sample was placed on a flat surface so that one principal surface on which the electroconductive portion was arranged faced upward and another principal surface faced downward, a protruding state toward the one principal surface was expressed in a negative value and a protruding state toward the another principal surface was expressed in a positive value.

In addition, adhesive strength of the electroconductive portion 20 to the main body portion 10 was checked for the obtained samples. Specifically, a Ni-plating layer having a thickness of from 2 μm to 3 μm was formed on an electroconductive portion having a width of 2 mm and a length of 5 mm. An L-shaped holding member made of metal with a width of 0.7 mm, a length of 5 mm, and a height of 2.5 mm in a direction perpendicular to a length direction was bonded by brazing at its portion having the length of 5 mm. Next, the holding member and the sample were held, and a distal end portion of the holding member, which had the height of 2.5 mm, was pulled in a direction perpendicular to an interface between the electroconductive portion and the main body portion. A load at a time when the electroconductive portion was separated from the main body portion was measured as the adhesive strength. For the measurement, a digital force gauge (model number ZP200N) manufactured by IMADA Co., Ltd. was used. When the adhesive strength is 9.8 N (1 kgf) or larger, the adhesive strength can be determined as sufficient. When the adhesive strength is less than 9.8 N, the adhesive strength can be determined as insufficient. The results of the experiment described above are shown in Table 1.

TABLE 1

| Sample number | First metal component | Area ratio of glass phase (%) | Proportion based on aspect ratio (%) 1.5 or less | 2 or less | Resistivity (Ω · μm) Determination | | Warpage (μm) Determination | | Adhesive strength (N) Determination | | Comprehensive Determination |
|---|---|---|---|---|---|---|---|---|---|---|---|
| 1 | W | 38.0 | 28.1 | 62.5 | C | 0.25 | A | 19.0 | A | 46.09 | C |
| 2 | W | 27.2 | 29.0 | 54.5 | A | 0.14 | C | 39.2 | A | 42.17 | C |
| 3 | W | 19.8 | 30.0 | 55.5 | A | 0.12 | C | 59.1 | A | 38.25 | C |

TABLE 1-continued

| Sample number | First metal component | Area ratio of glass phase (%) | Proportion based on aspect ratio (%) 1.5 or less | 2 or less | Resistivity (Ω · μm) Determination | | Warpage (μm) Determination | | Adhesive strength (N) Determination | | Comprehensive Determination |
|---|---|---|---|---|---|---|---|---|---|---|---|
| 4 | W | 19.8 | 50.0 | 91.1 | A | 0.12 | A | 25.2 | A | 38.25 | A |
| 5 | W | 8.2 | 68.0 | 86.8 | A | 0.11 | A | 24.4 | A | 19.61 | A |
| 6 | W | 7.8 | 74.2 | 93.9 | A | 0.10 | A | 23.8 | A | 20.59 | A |
| 7 | W | 6.1 | 68.2 | 87.9 | A | 0.09 | A | 7.0 | A | 18.63 | A |
| 8 | W | 9.2 | 58.1 | 87.7 | A | 0.12 | A | −10.8 | A | 22.56 | A |
| 9 | W | 6.7 | 63.1 | 83.3 | A | 0.11 | A | −15.4 | A | 14.71 | A |
| 10 | W | 9.7 | 60.4 | 80.6 | B | 0.15 | A | −12.6 | A | 19.61 | A |
| 11 | W | 7.9 | 42.0 | 65.9 | B | 0.16 | A | −11.6 | A | 13.73 | A |
| 12 | W | 3.0 | 60.0 | 79.3 | A | 0.08 | A | −17.0 | A | 10.79 | A |
| 13 | W | 2.8 | 48.4 | 71.1 | A | 0.08 | A | −15.5 | C | 8.83 | C |
| 14 | Mo | 30.0 | 29.4 | 61.9 | C | 0.20 | C | −31.4 | A | 49.03 | C |
| 15 | Mo | 19.5 | 32.7 | 60.8 | B | 0.17 | C | −44.0 | A | 47.07 | C |
| 16 | Mo | 19.1 | 75.1 | 90.0 | B | 0.15 | A | −15.0 | A | 46.09 | A |

In Table 1, for the resistivity, a resistivity lower than 0.15 Ω·μm was evaluated as “A”, a resistivity equal to or higher than 0.15 Ω·μm and lower than 0.2 Ω·μm was evaluated as “B”, and a resistivity equal to or higher than 0.2 Ω·μm was evaluated as “C”. For the warpage, warpage of an absolute value smaller than 30 μm was evaluated as “A”, and warpage of 30 μm or larger was evaluated as “C”. For the adhesive strength, adhesive strength equal to or larger than 9.8 N was evaluated as “A”, and adhesive strength less than 9.8 N was evaluated as “C”. For the comprehensive evaluation, a sample evaluated as “C” for at least one of the above-mentioned three evaluation items was evaluated as “C”, and a sample not evaluated as “C” for any of the evaluation items was evaluated as “A”. That is, “A” indicates excellent, “C” indicates poor, and “B” indicates medium. Further, an example of analysis using the image processing software for how the glass phases 32 were present in the electroconductive portion 20 is illustrated in FIG. 6.

Figure 6:
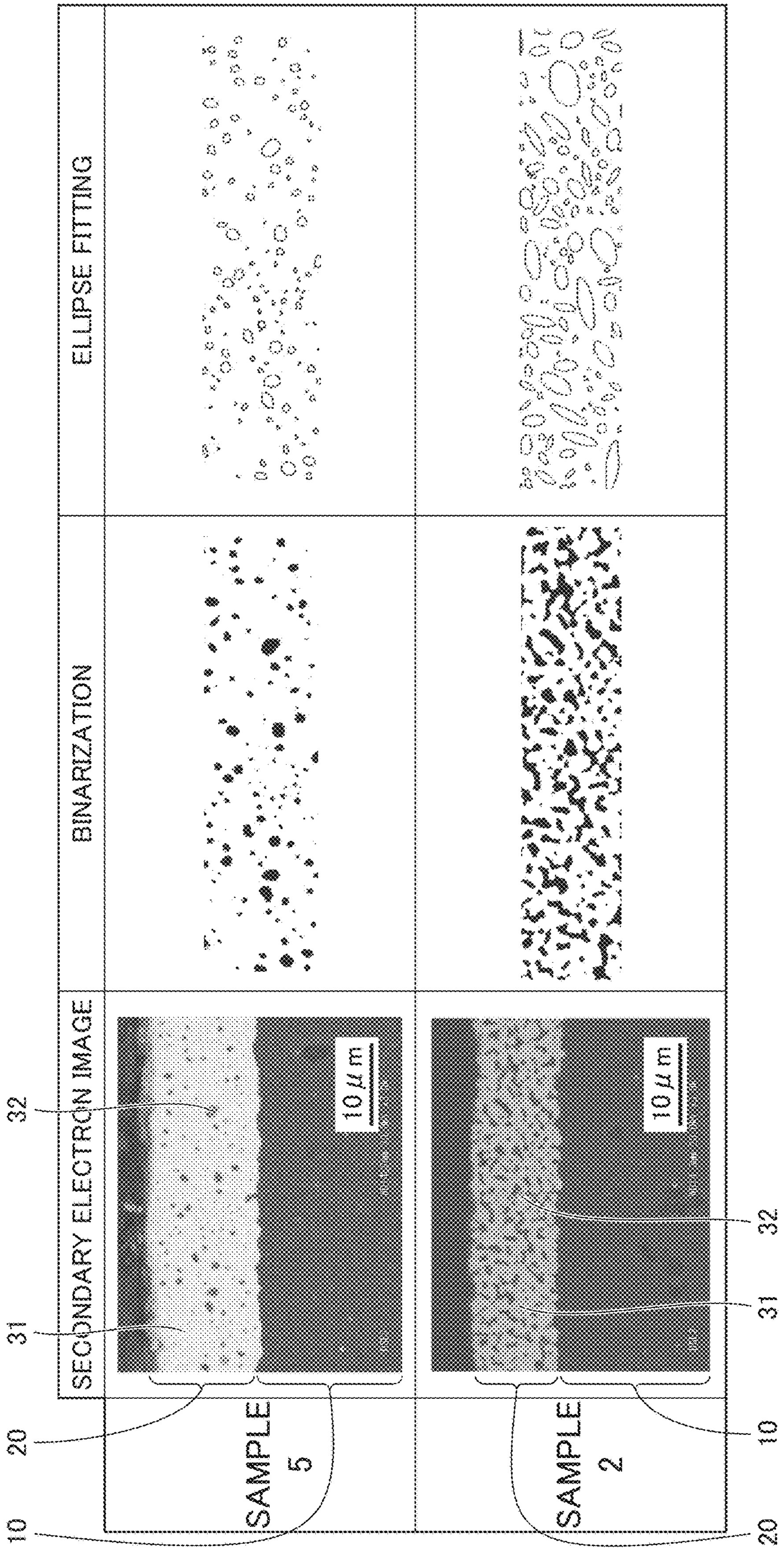
FIG. 6 is an explanatory view for illustrating analysis of how glass phases are present in the electroconductive portion.

In FIG. 6, a secondary electron image of a cross section around an interface between the electroconductive portion 20 and the main body portion 10, an image obtained by binarizing the secondary electron image of the electroconductive portion 20, and an image obtained by the ellipse fitting performed based on the binarized image are illustrated for each of Samples 5 and 2. Photographs (secondary electron images) of cross sections of the samples are shown in a left column of FIG. 6, the results of binarization of the secondary electron images of the cross sections of the electroconductive portions are shown in a middle column, and the results of ellipse fitting of the results of binarization are shown in a right column. White regions in the secondary electron image represent the metal component (W), and black regions represent the glass phases. Black regions in the result of binarization represent the glass phases. Regions, each surrounded by a black line, in the result of ellipse fitting represent the glass phases.

With reference to FIG. 6, it is understood that the area ratio of the glass phases in Sample 5 was smaller and the proportion of the glass phases 32, each having a small aspect ratio, was higher than those in Sample 2. Based on such image data, the binarization and the ellipse fitting were performed on the image data of the electroconductive portion 20 to calculate the area ratio of the glass phases 32 and the aspect ratio of each of the glass phases 32.

With reference to Table 1, in Sample 1, the area ratio of the glass phases was outside the range of 3% or more and 20% or less corresponding to the range of the present disclosure. Specifically, the area ratio of the glass phases exceeded 20%. As a result, the resistivity was 0.2 Ω·μm or higher. Thus, in terms of the electrical resistance, it is not considered that Sample 1 was preferred. In each of Samples 2 and 3, the area ratio of the glass phases 32 was less than that in Sample 1. As a result, the resistivity was lower than 0.15 Ωμm. Thus, it is considered that a preferred state was obtained in terms of the electrical resistance. However, the proportion of the number of glass phases, each having the aspect ratio of 1.5 or less, and the proportion of the number of glass phases, each having the aspect ratio of 2 or less, to the total number of glass phases were less than 40% and less than 65%, respectively. As a result, the absolute value of the warpage exceeded 30 μm. Thus, it is not considered that Samples 2 and 3 were preferred in terms of the warpage.

Meanwhile, in each of Samples 4 to 12, the area ratio of the glass phases 32 fell within the range of 3% or more and 20% or less corresponding to the range of the present disclosure, and the proportion of the number of the glass phases 32, each having the aspect ratio of 1.5 or less, and the proportion of the number of the glass phases 32, each having the aspect ratio of 2 or less, to the total number of the glass phases 32 were 40% or more and 65% or more, respectively. As a result, the above-mentioned samples were evaluated as “A” or “B” for all the items, that is, the resistivity, the warpage, and the adhesive strength. Thus, it is considered that preferred characteristics were obtained. In particular, the samples with the area ratio of the glass phases 32 being 8% or more and 20% or less had the adhesive strength of 19.6 N (2 kgf) or larger. Thus, it is considered that more preferred characteristic were obtained.

In Sample 13, the area ratio of the glass phases was outside the range of 3% or more and 20% or less corresponding to the range of the present disclosure. Specifically, the area ratio of the glass phases was less than 3%. As a result, the adhesive strength was less than 9.8 N (less than 1 kgf). In terms of the adhesive strength of the electroconductive portion 20 to the main body portion 10, it is not considered that Sample 13 was preferred. From the results described above, the following is confirmed. The formation of the glass phases 32 resulting from the sintering aid in the main body portion 10 contributed to an increase in adhesive strength of the electroconductive portion 20 to the main body portion 10. When the glass phases 32 were reduced to the area ratio at the extent of less than the lower limit in the range of the present disclosure, the adhesive strength was insufficient.

Further, in Samples 14 to 16, Mo was employed as the first metal component in place of W that was employed in Samples 1 to 13. From the above-mentioned results of the experiment, it is confirmed that, even when Mo was employed as the first metal component, there was the same trend as that observed when W was employed.

From the results of the experiment described above, it is confirmed that the ceramic wiring member according to the present disclosure enables achievement of both of a reduction in warpage and a reduction in electrical resistance of the electroconductive portions.

In the embodiments, the main body portion 10 including the side wall portion 12 has been described. The ceramic wiring member according to the present disclosure is not limited to that described above, and may include the main body portion 10 having a flat plate-like shape without the side wall portion 12. Such ceramic wiring member is used as a ceramic wiring board on which an electronic component is to be mounted. Further, in view of a reduction in contact resistance or the like, a plating layer formed of a nickel (Ni) layer, a gold (Au) layer, or the like may be formed on surfaces of the internal terminals 21 and the external terminals 25.

It is to be understood that the embodiments and Examples disclosed herein are merely examples in all aspects and in no way intended to limit the present disclosure in any aspect. The scope of the present disclosure is defined by the appended claims and not by the above description, and it is intended that the present disclosure encompasses all modifications made within the scope and spirit equivalent to those of the appended claims.

REFERENCE SIGNS LIST

1 ceramic wiring member, 10 main body portion, 10A cavity, 11 bottom wall portion, 11A first principal surface, 11B second principal surface, 12 side wall portion, 12A first end surface, 12B second end surface, 20 electroconductive portion, 21 internal terminal, 22 first connecting portion, 23 internal wiring, 24 second connecting portion, 25 external terminal, 26 upper terminal, 27 third connecting portion, 28 lower terminal, 29 fourth connecting portion, 30 intermediate terminal, 31 electroconductive phase, 31A air gap, 32 glass phase, 121 protruding portion, 121A second surface, 121B first surface, 121C third surface.

The invention claimed is:

1. A ceramic wiring member, comprising:

a main body portion, which is made of ceramic and has a plate-shaped portion; and an electroconductive portion arranged in contact with the plate-shaped portion, wherein the electroconductive portion has a structure including:

an electroconductive phase, which is made of a metal component containing at least one of W or Mo and has a plurality of air gaps dispersed so as to be separated from each other; and glass phases, which are contained in at least some of the plurality of air gaps and have an area ratio of 3% or more and 20% or less on a cross section of the plate-shaped portion taken in a thickness direction, and wherein a proportion of the number of the glass phases, each having an aspect ratio of 1.5 or less, to a total number of the glass phases on the cross section of the plate-shaped portion taken in the thickness direction is 40% or more.

2. The ceramic wiring member according to claim 1, wherein a proportion of the number of the glass phases, each having the aspect ratio of 2 or less, to the total number of the glass phases on the cross section of the plate-shaped portion taken in the thickness direction is 65% or more.

3. The ceramic wiring member according to claim 2, wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in the thickness direction of the plate-shaped portion.

4. The ceramic wiring member according to claim 1, wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in the thickness direction of the plate-shaped portion.

* * * * *